United States Patent
Aluru

(10) Patent No.: US 7,539,902 B2
(45) Date of Patent: May 26, 2009

(54) APPLICATION LEVEL TESTING OF INSTRUCTION CACHES IN MULTI-PROCESSOR/MULTI-CORE SYSTEMS

(75) Inventor: Rama Koteswara Vamsee Aluru, Bangalore (IN)

(73) Assignee: Sun Microsystems, Inc., Santa Clara, CA (US)

( * ) Notice: Subject to any disclaimer, the term of this patent is extended or adjusted under 35 U.S.C. 154(b) by 414 days.

(21) Appl. No.: 11/583,589

(22) Filed: Oct. 19, 2006

(65) Prior Publication Data

US 2008/0155341 A1    Jun. 26, 2008

(51) Int. Cl.
    *G06F 11/00*    (2006.01)
(52) U.S. Cl. ......................................................... 714/38
(58) Field of Classification Search ................ 714/9–12, 714/17, 18, 25–27, 30–33, 37–39, 45
    See application file for complete search history.

(56) References Cited

U.S. PATENT DOCUMENTS 5,073,891 A * 12/1991 Patel ........................... 714/720
5,781,721 A * 7/1998 Hayes et al. ................... 714/42
6,925,591 B2 * 8/2005 Patwardhan et al. ......... 714/733
6,966,017 B2 * 11/2005 Evans .......................... 714/718
7,447,883 B2 * 11/2008 Vasekin et al. ............... 712/238
2008/0250291 A1 * 10/2008 Yamada et al. .............. 714/738

* cited by examiner

*Primary Examiner*—Nadeem Iqbal
(74) *Attorney, Agent, or Firm*—Osha • Liang LLP

(57) ABSTRACT

A method and apparatus performs computer application level testing of an instruction cache in multi-processor or multi-core systems. Instruction cache cannot be written to and read from directly. Thus, one microprocessor core is utilized to perform application level testing of an instruction cache of another microprocessor core. The method and apparatus uses two software threads: a controller thread and a target thread. The target thread uses a portion of the instruction cache as a scratch pad for synchronization with the controller thread. The controller thread controls the sequence of operations to perform a March test on the target instruction cache.

18 Claims, 11 Drawing Sheets

Single Core Microprocessor

System
(Single Multi Core
Microprocessor)

78

Given memory starting at address X and aligned to size of instruction cache line Line 1: X to X + instruction cache line size – 1
Line 2: x + instruction cache line size to X + 2 * instruction cache line size – 1

...

Line K: X + (K – 1) * instruction cache line size to X + K * instruction cache line size - 1

Figure 8

Organization of dynamically allocated memory Synonymous with Target Instruction Cache Target Instruction
Cache
(Scratch Pad)

```
Z: While (flag != 0) wait;
Retrieve the next march element for the given march test
If (read operation on location K)
    {
    Set the value of X (in dynamically allocated memory to K (X is present at Y + 3 *
size of each instruction in the allocated memory region)
    }
Else if (write pattern D to location K)
    {
    Write appropriate data background pattern to location K in the dynamically
allocated memory
    Set the value of X in dynamically allocated memory to K (X is present at Y + 3 *
size of each instruction in the allocated memory region)
    }
Set flag = 1;
Goto Z;
```

Controller Thread
Instruction Cache

Figure 11

APPLICATION LEVEL TESTING OF INSTRUCTION CACHES IN MULTI-PROCESSOR/MULTI-CORE SYSTEMS

BACKGROUND

A computer system 10, as shown in FIG. 1, includes several components that are collectively used by a user to perform various functions such as, for example, generating a document with a word processor. With the computer system 10, the user may input data to a computing portion 12 using peripheral devices such as a keyboard 18 or a mouse 20. Data may also be provided to the computing portion 12 using data storage devices (e.g. a floppy disk, fixed disk, flash device, CD, or DVD). The computing portion 12, using memory and other internal components, processes both internal data and data provided to the computing portion 12 by the user to generate data requested by the user. The generated data may be provided to the user via, for example, a display device 14 or a printer 16. The computing portion 12 of a computer system typically includes various components such as, for example, a power supply, data storage devices, and circuit boards containing circuitry required to perform the necessary and requested operations of the computer system.

The computing portion 12 may contain a plurality of circuit boards (e.g. printed circuit boards (PCBs) or printed wiring boards (PWBs)) on which various circuit components are implemented. In general, the computing portion 12 is comprised of at least one PCB containing one or more microprocessors, memory, integrated circuits (ICs), application specific integrated circuits (ASICs), programmable logic devices (PLDs), field-programmable gate arrays (FPGAs), discrete logic, active components, and passive components. A PCB utilizes wires or traces of conductive material to provide interconnections between the various components that comprise the computing portion 12.

A single-core microprocessor 22 is shown in FIG. 2. The single-core microprocessor 22 is comprised of a single-core 24 in a single package. A multi-core microprocessor 26 is shown in FIG. 3. A multi-core microprocessor 26 is comprised of a plurality of cores 28, 30 in a single package. One of ordinary skill in the art will recognize, for example, a dual core microprocessor to be a single package containing two cores.

The computing portion 12 may be comprised of a system 32 containing a plurality of single-core microprocessors 34, 36 as shown in FIG. 4. The single-core microprocessors 34, 36 are each comprised of single cores 38, 40. One of ordinary skill in the art will recognize that such a system 32, for example, could be comprised of any number of single-core microprocessors 34, 36.

The computing portion 12 may be comprised of a system 44 containing a single multi-core microprocessor 44 as shown in FIG. 5. The multi-core microprocessor 44 is comprised of a plurality of cores 46, 48. The computing portion 12 may be comprised of a system 50 containing a plurality of multi-core microprocessors 52, 54 as shown in FIG. 6. Each multi-core microprocessor 52, 54 is comprised of a plurality of cores 56, 58, 60, 62. One of ordinary skill in the art will recognize that such a system 50 could be comprised of a plurality of multi-core microprocessors 52, 54.

One of ordinary skill in the art will recognize that a microprocessor typically contains a significant amount of Static Random Access Memory (SRAM) on die. Typical microprocessors utilize SRAM for an instruction cache and a data cache, which store repeatedly accessed instructions and data.

Spot defects in SRAM can be caused by imperfections during the fabrication process. Spot defects include opens, shorts, and bridges. One of ordinary skill in the art will recognize an "open" as an extra resistance within a connection, a "short" as an undesired resistive path between a node and power or ground, and a "bridge" as an undesired resistive path between two connections which are not power or ground.

There are various fault models by which these SRAM spot defects can be characterized. One of ordinary skill in the art will recognize the use of March tests and other methods for detecting these spot defects in SRAM by executing a sequence of read and write operations on the SRAM.

SUMMARY

According to one aspect of one or more embodiments of the present invention, a method of performing computer system operations, comprising: allocating memory; binding a controller thread to a microprocessor core; binding a target thread to another microprocessor core; filling the allocated memory with data; synchronizing a controller thread and a target thread to execute a sequence of read operations and write operations on a target instruction cache, comprising: performing read operations on a target instruction cache, comprising: reading a value and writing the same value to a memory location within the allocated memory corresponding to a instruction cache line; setting the value of a index to the memory location within the allocated memory corresponding to a instruction cache line; enabling a target instruction cache to execute a instruction cache line corresponding to the memory location within the allocated memory corresponding to a instruction cache line, identified by a index; and incrementing a index to correspond to another memory location within the allocated memory corresponding to a instruction cache line. Performing write operations on a target instruction cache, comprising: writing data background pattern to a memory location within the allocated memory corresponding to a instruction cache line; setting the value of a index to the memory location within the allocated memory corresponding to a instruction cache line; enabling a target instruction cache to execute a instruction cache line corresponding to the memory location within the allocated memory corresponding to a instruction cache line, identified by a index; and incrementing a index to correspond to another memory location within the allocated memory corresponding to a instruction cache line. Reporting errors generated as a result of performing read operations and write operations.

According to one aspect of one or more embodiments of the present invention, a computer system, comprising: one or more microprocessors; memory operatively connected to one or more microprocessors; and instructions residing in memory and executable by one or more microprocessors, the instructions comprising instructions to: allocating memory; binding a controller thread to a microprocessor core; binding a target thread to another microprocessor core; filling the allocated memory with data; synchronizing a controller thread and a target thread to execute a sequence of read operations and write operations on a target instruction cache, comprising: performing read operations on a target instruction cache, comprising: reading a value and writing the same value to a memory location within the allocated memory corresponding to a instruction cache line; setting the value of a index to the memory location within the allocated memory corresponding to a instruction cache line; enabling a target instruction cache to execute a instruction cache line corresponding to the memory location within the allocated memory corresponding to a instruction cache line, identified by a index; and incrementing a index to correspond to another memory location within the allocated memory corresponding to a instruction cache line. Performing write operations on a target instruction cache, comprising: writing data background pattern to a memory location within the allocated memory corresponding to a instruction cache line; setting the value of a index to the memory location within the allocated memory corresponding to a instruction cache line; enabling a target instruction cache to execute a instruction cache line corresponding to the memory location within the allocated memory corresponding to a instruction cache line, identified by a index; and incrementing a index to correspond to another memory location within the allocated memory corresponding to a instruction cache line. Reporting errors generated as a result of performing read operations and write operations.

Other aspects of the present invention will be apparent from the following description and the appended claims.

BRIEF DESCRIPTION OF DRAWINGS

FIG. 8 shows allocated memory corresponding to an instruction cache in accordance with an embodiment of the present invention.

FIG. 11 shows a controller thread in accordance with an embodiment of the present invention.

DETAILED DESCRIPTION

Figure 1:
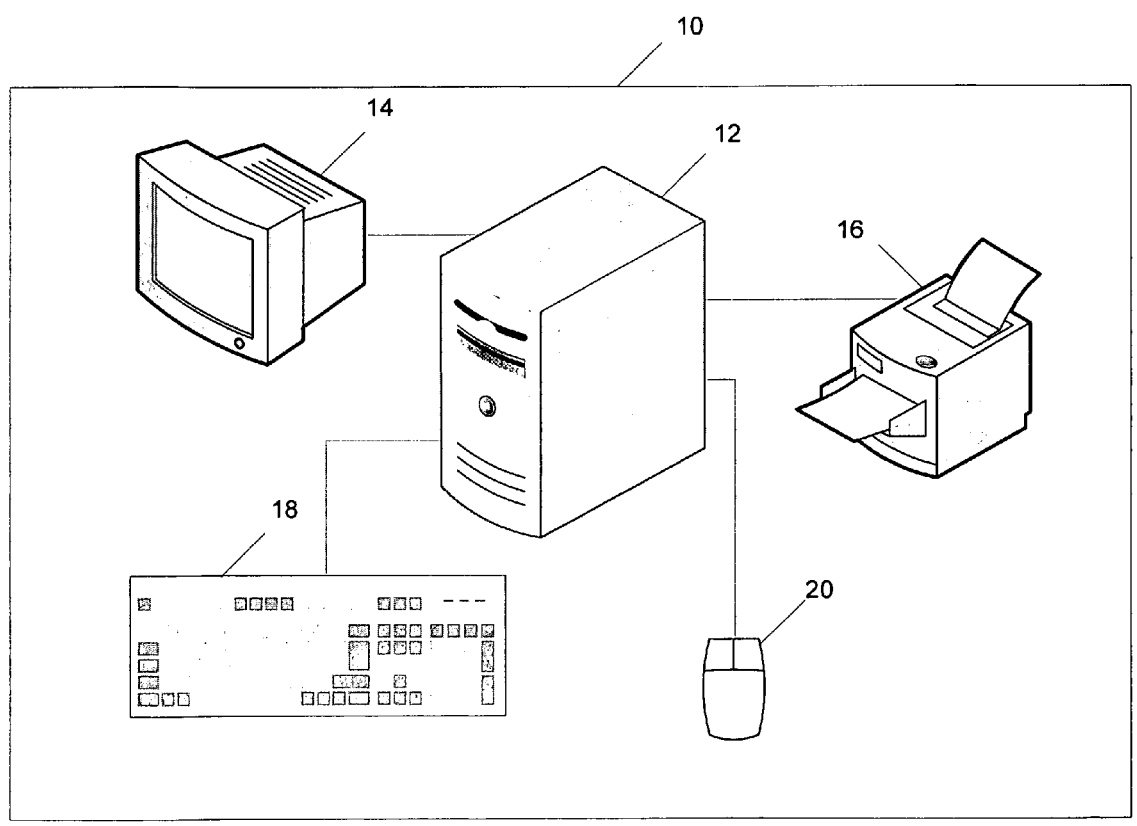
FIG. 1 shows a typical computer system.
Figure 2:
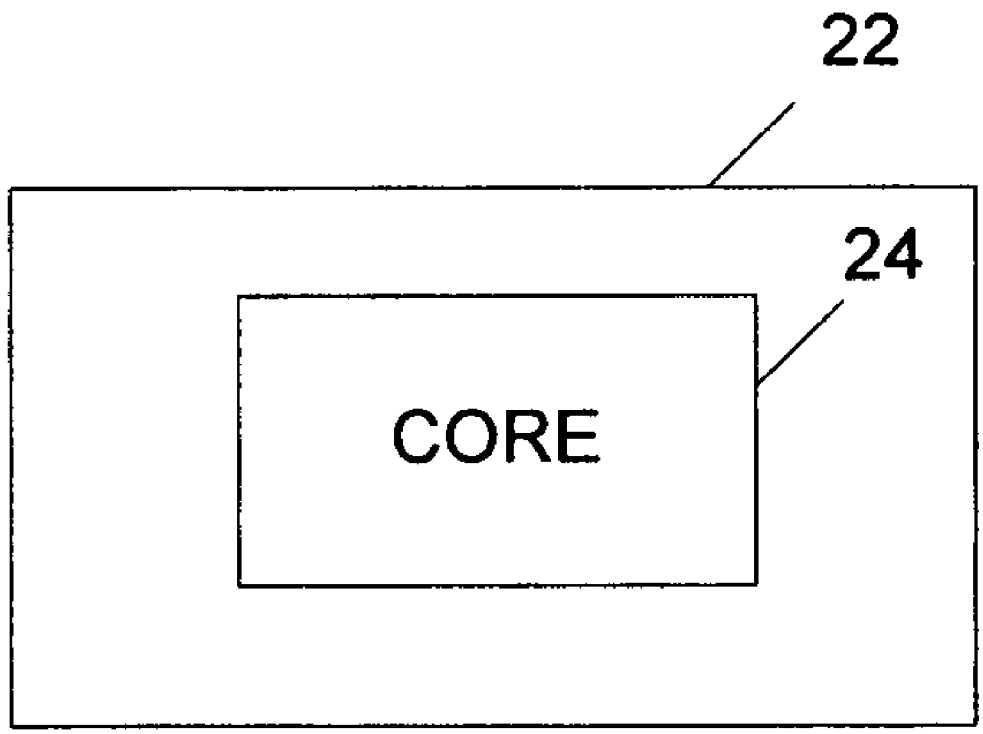
FIG. 2 shows a single-core microprocessor.
Figure 3:
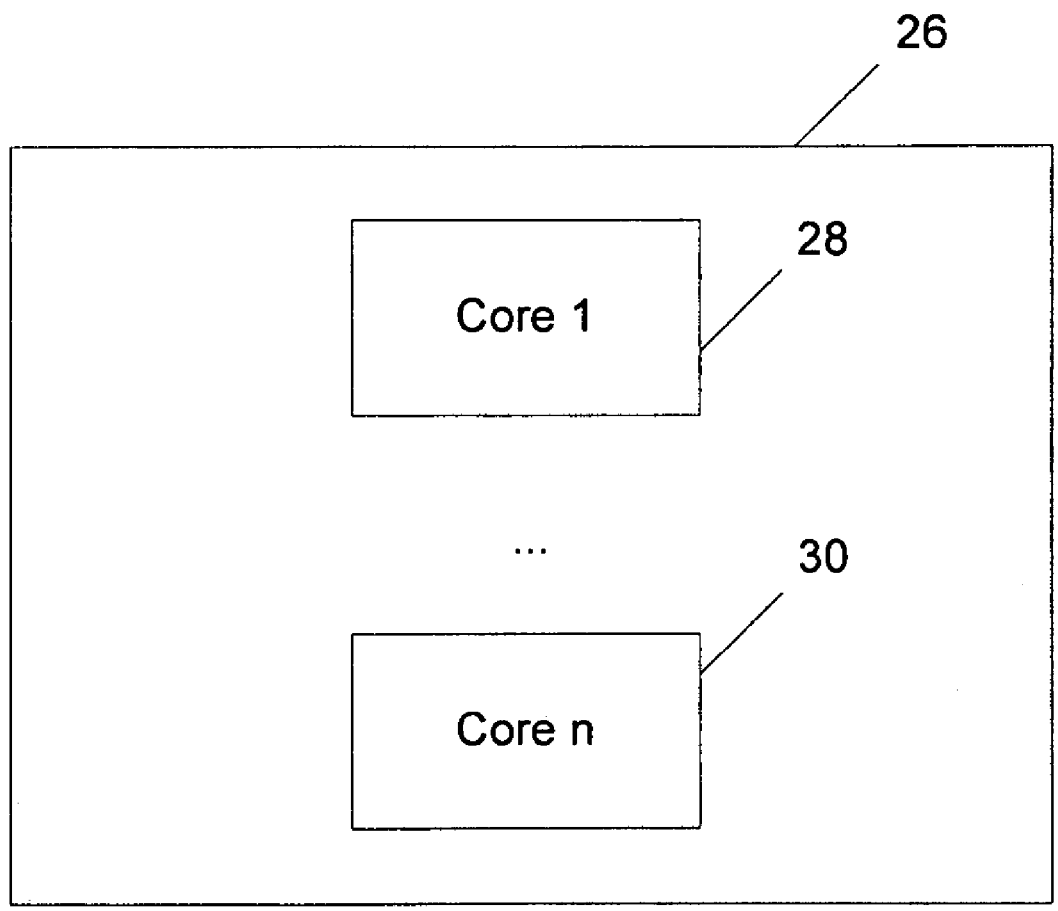
FIG. 3 shows a multi-core microprocessor.
Figure 4:
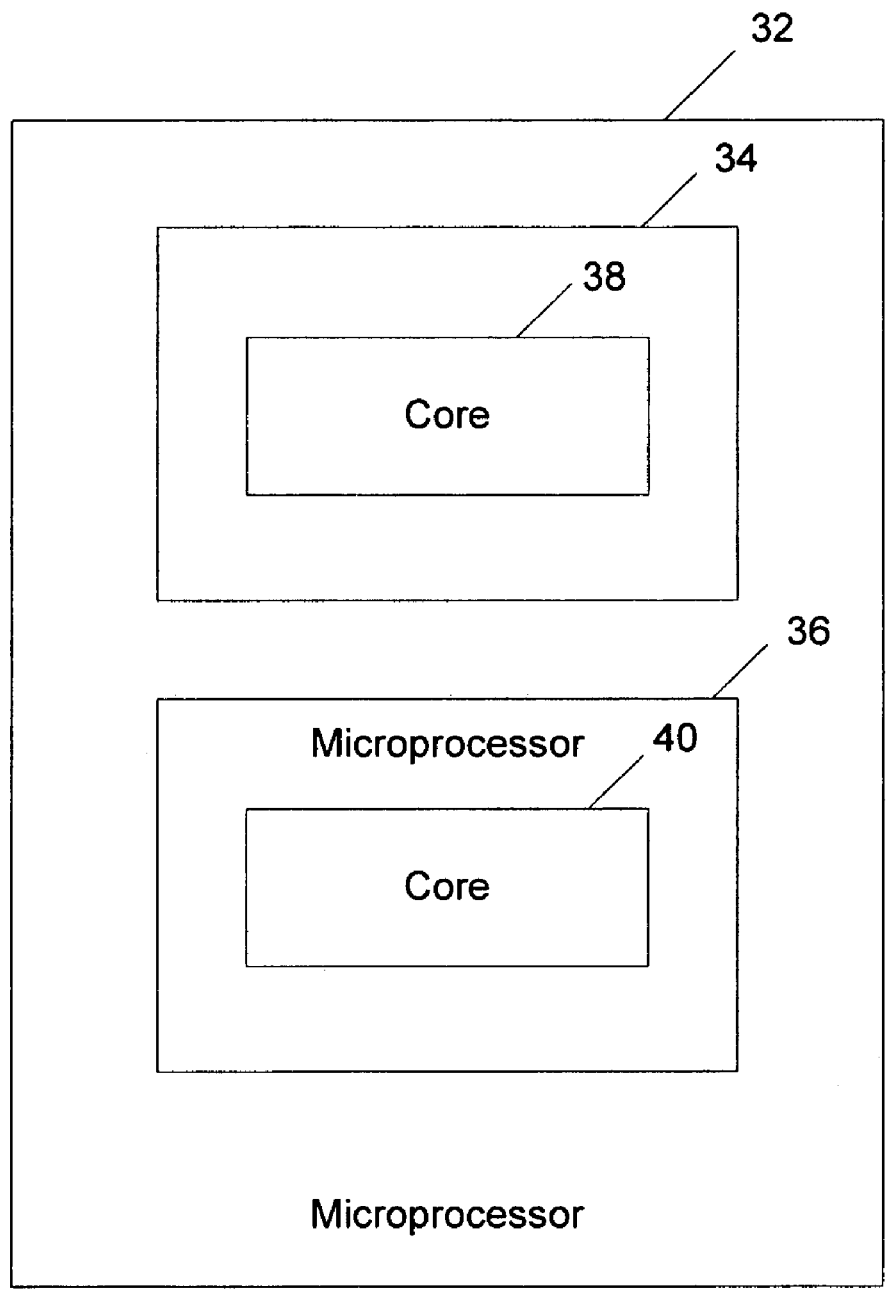
FIG. 4 shows a computer system comprised of two single-core microprocessors.
Figure 5:
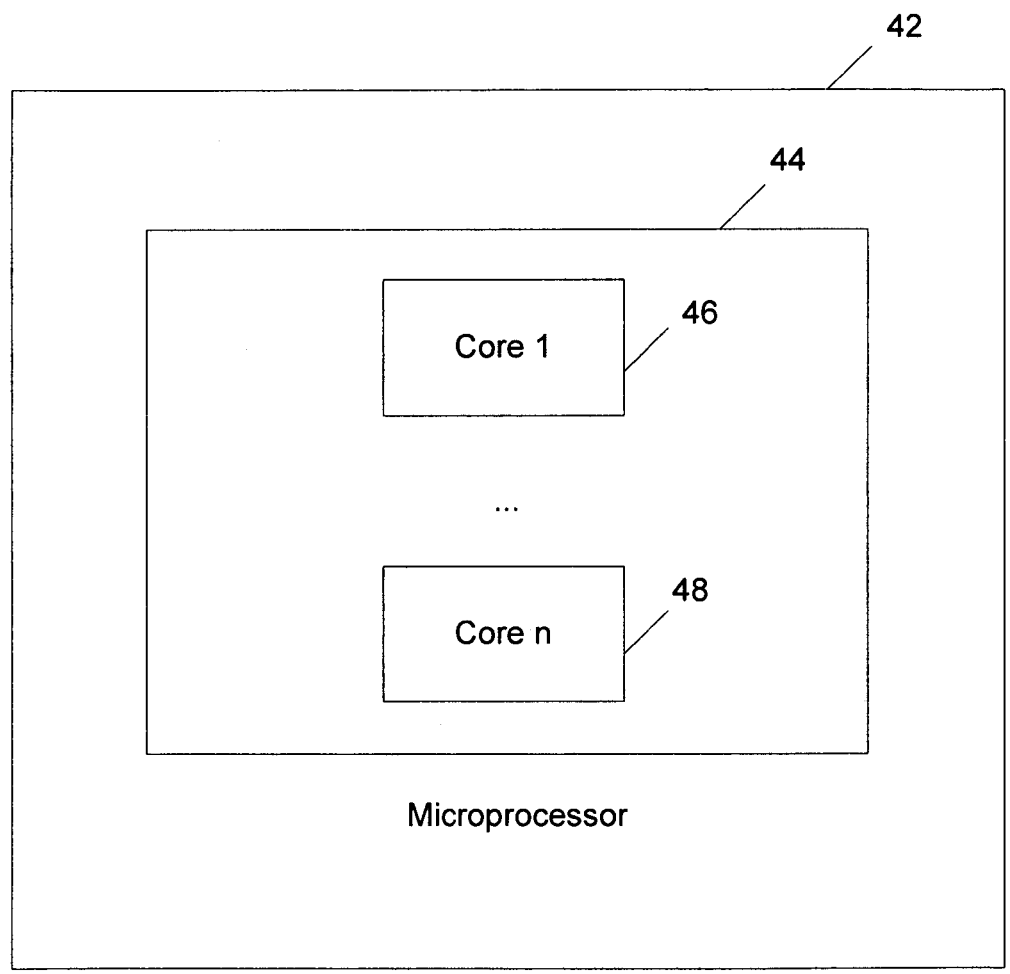
FIG. 5 shows a computer system comprised of a single multi-core microprocessor.
Figure 6:
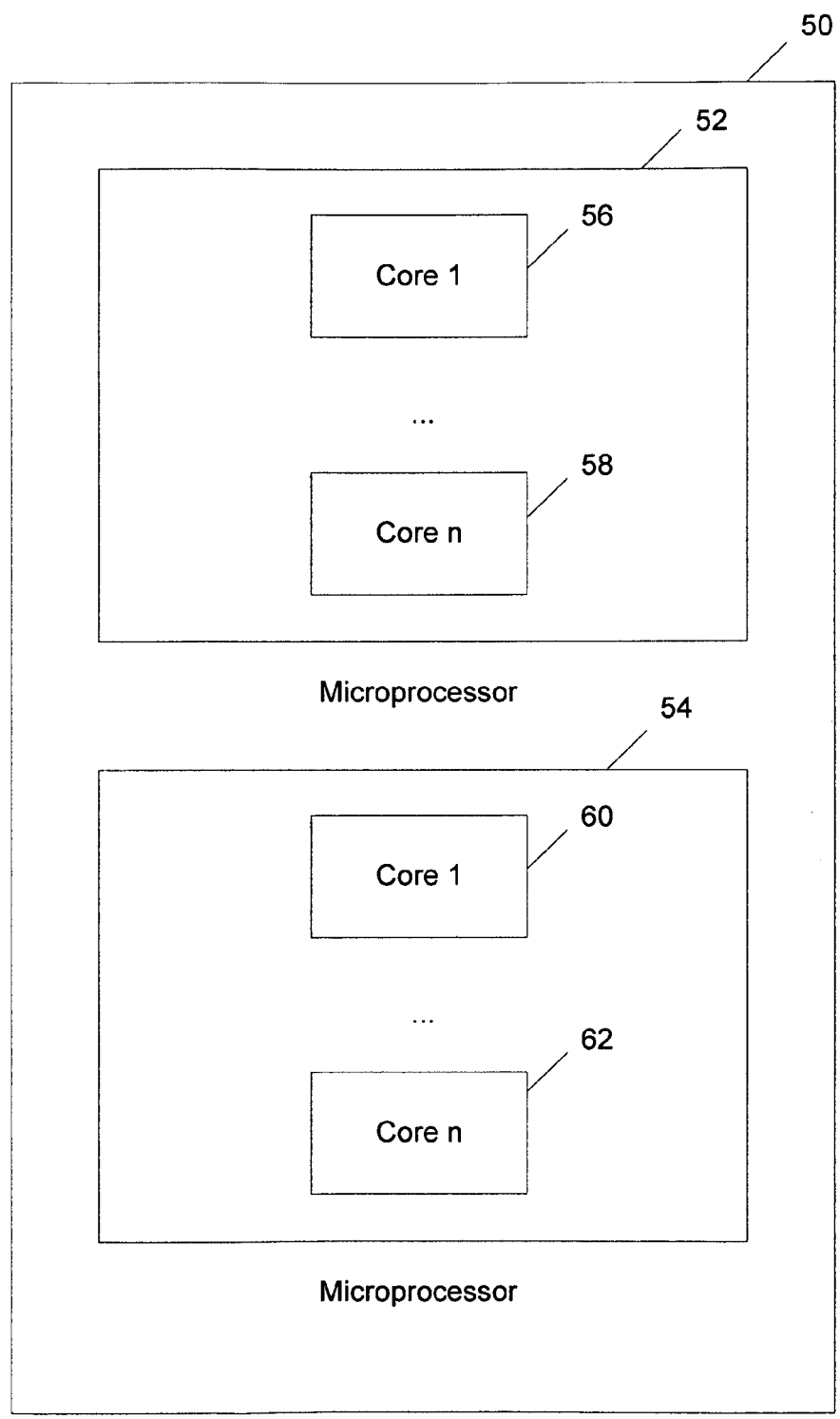
FIG. 6 shows a computer system comprised of a plurality of multi-core microprocessors.

Specific embodiments of the present invention will now be described in detail with reference to the accompanying figures. Like elements in the various figures are denoted by like reference numerals for consistency. Further, in the following detailed description of embodiments of the present invention, numerous specific details are set forth in order to provide a more thorough understanding of the present invention. In other instances, well-known features have not been described in detail to avoid obscuring the description of embodiments of the present invention.

One of ordinary skill in the art will recognize that it is straightforward to perform application level testing of a data cache, as a data cache can be written to and read from directly. Embodiments of the present invention relate to a method of performing application level testing of an instruction cache in multi-processor/multi-core systems. Generally, in one or more embodiments of the present invention, a microprocessor core is utilized to perform application level testing of an instruction cache of another microprocessor core.

Figure 7:
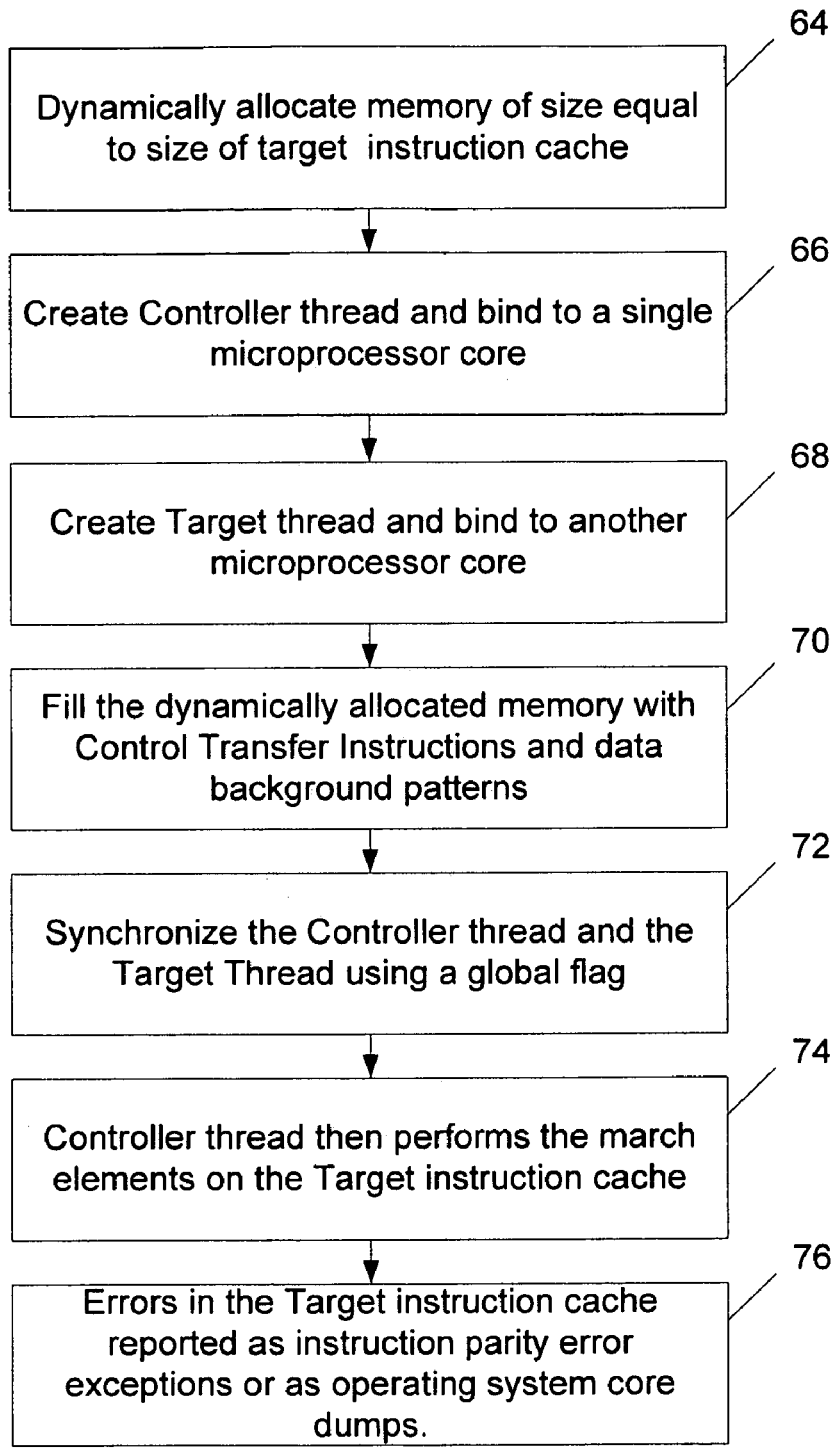
FIG. 7 shows a flow process in accordance with an embodiment of the present invention.

FIG. 7 shows a flow process in accordance with an embodiment of the present invention. Memory is dynamically allocated of size equal to an instruction cache 64. A controller thread is created and bound to a microprocessor core 66. A target thread is created and bound to another microprocessor core 68. One of ordinary skill in the art will readily appreciate the process of binding a thread to a core and, accordingly, it will not be discussed in detail here. The dynamically allocated memory is filled with control transfer instructions and data background patterns 70. One of ordinary skill in the art will recognize control transfer instructions as instructions that change the sequence of code execution, for example, a jump instruction. A controller thread and a target thread are synchronized using a global flag. One of ordinary skill in the art will recognize a global flag as an indicator implemented in software or hardware that is accessible to a controller thread bound to a microprocessor core and a target thread bound to another microprocessor core. A controller thread and a target thread perform the test sequence on a target instruction cache 74. Errors in a target instruction cache are reported as instruction parity error exceptions or as operating system core dumps 76.

Because it is not possible to directly write to an instruction cache, in accordance with one or more embodiments of the present invention, memory is dynamically allocated of a size equal to that of an instruction cache to be tested. One of ordinary skill in the art will recognize an instruction cache is comprised of a plurality of instruction cache lines where the instruction cache line size represents the size normally accessed by a microprocessor. As shown in FIG. 8, given a starting memory address X, the first line of the dynamically allocated memory would reside from location (X) to (X+instruction cache line size−1) 78. Thus, the kth line of the dynamically allocated memory corresponding to an instruction cache would reside at (X+(k−1)*instruction cache line size) to (X+k*instruction cache line size−1) 78.

Figure 9:
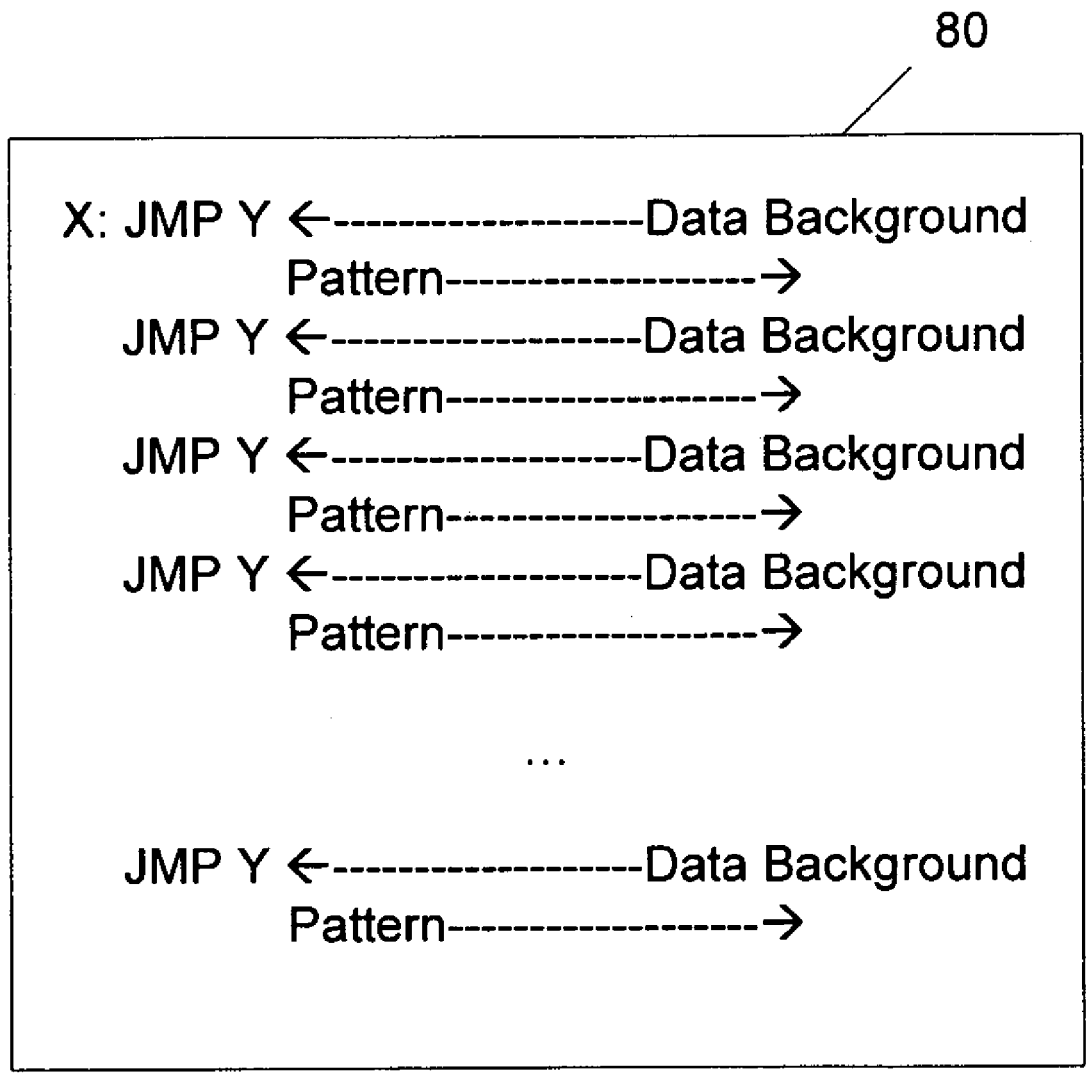
FIG. 9 shows contents of allocated memory corresponding to an instruction cache in accordance with an embodiment of the present invention.

A controller thread fills the dynamically allocated memory that corresponds to an instruction cache with control transfer instructions and data background patterns 80 as shown in FIG. 9. Each line of the dynamically allocated memory that corresponds to an instruction cache line contains a control transfer instruction and a data background pattern 80.

Figure 10:
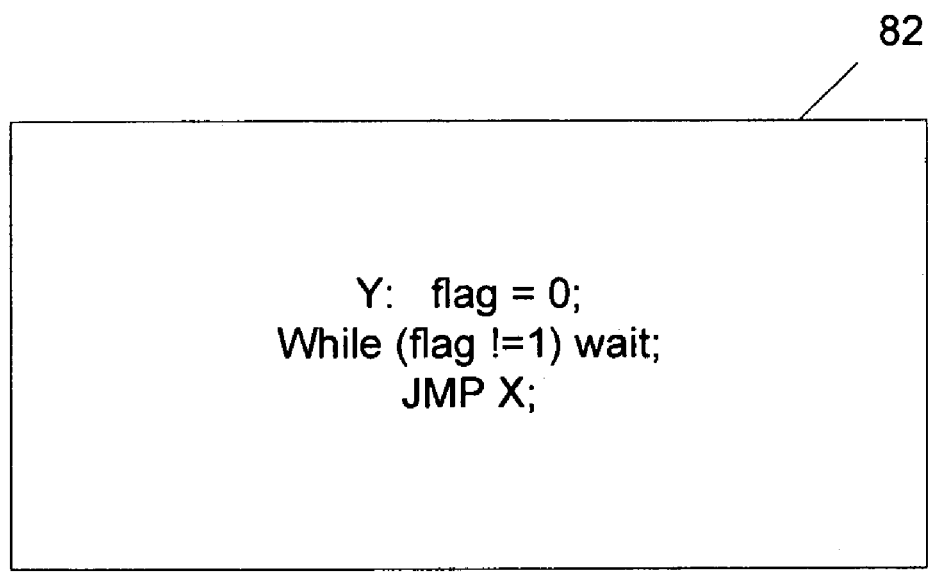
FIG. 10 shows a scratch pad process of a target thread in accordance with an embodiment of the present invention.

A portion of the dynamically allocated memory that corresponds to an instruction cache starting at memory address Y contains a scratch pad 82 as shown in FIG. 10 that is utilized to synchronize the controller thread and the target thread. The scratchpad clears a global flag and then waits for a global flag to be set by a controller thread. Once a global flag is set by a controller thread, the scratchpad then executes a jump instruction to memory address X 82 that represents the starting address of a line in the dynamically allocated memory corresponding to an instruction cache line.

A controller thread, in accordance with one or more embodiments of the present invention, is shown in FIG. 11. A controller thread waits until a global flag is cleared 84. A controller thread then selects the next test sequence to be executed, for example, the next element of a March SS test. One of ordinary skill in the art will recognize a March SS test as a typical protocol for testing SRAM memories. Other test sequences could be utilized in the place of a March SS test.

If the next element of a March SS test is a read of location k, a controller thread performs a read and write to the same location of the same value, which invalidates the corresponding instruction cache line in a instruction cache under test, thereby bringing the line into a data cache. A controller thread then sets the value of X to k, sets the global flag, and returns to the wait state 84. Because a global flag is set, a target thread will jump to location X, thereby causing the microprocessor under test to execute the instruction cache line corresponding to location X in the dynamically allocated memory. Upon the successful execution of the line corresponding to location X, a target thread will clear a global flag and return to the wait state.

If there is an error during the execution of the March SS element read, an instruction parity error exception or an operating system core dump is generated. One of ordinary skill in the art will recognize that an instruction parity error exception or an operating system core dump to be a system mechanism by which certain errors are reported to the user.

If the next element of a March SS test is a write to location k, a controller thread will write a control transfer instruction and appropriate data background pattern to line k of the dynamically allocated memory that corresponds to line k in a instruction cache under test. A controller thread then sets the value of X to k, sets a global flag, and returns to the wait state 84. Because a global flag is set, a target thread will jump to location X, thereby causing the microprocessor under test to execute the instruction cache line corresponding to location X in the dynamically allocated memory. Upon the successful execution of the line corresponding to location X, a target thread will clear the global flag and return to the wait state.

If there is an error during the execution of the March SS element write, an instruction parity error exception or an operating system core dump is generated. One of ordinary skill in the art will recognize that an instruction parity error exception or an operating system core dump to be a system mechanism by which certain errors are reported.

One of ordinary skill in the art will recognize that a typical test protocol, like March SS, will execute a sequence of read and write operations. In one or more embodiments of the present invention, a controller thread, in concert with a target thread, will execute a sequence of read and write operations in order to test an instruction cache.

Advantages of one or more embodiments of the present invention may include one or more of the following. In one or more embodiments of the present invention, an instruction cache can be tested in system at the application level. In one or more embodiments, an instruction cache can be tested in system at the application level without having to shut down or reboot a computer system. In one or more embodiments, an instruction cache may be dynamically tested for defects.

In one or more embodiments, a method of testing an instruction cache may take a relatively short period of time due to the relatively small number of instructions executed. In one or more embodiments, a method of testing an instruction cache can be scaled to test all instruction caches within a given system. In one or more embodiments, a method for testing an instruction cache can be adapted to support different micro architectures.

While the invention has been described with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A method of performing computer system operations, comprising:

allocating memory;

binding a controller thread to a first microprocessor core;

binding a target thread to a second microprocessor core;

filling the allocated memory with data;

synchronizing the controller thread and the target thread to execute a sequence of read operations and write operations on a target instruction cache; and reporting errors generated as a result of performing the read operations and write operations, wherein the read operations and write operations on the target instruction cache comprise:

reading a value and writing the value read to a memory location within the allocated memory corresponding to an instruction cache line;

setting a value of an index to the memory location within the allocated memory corresponding to the instruction cache line;

enabling the target instruction cache to execute the instruction cache line corresponding to the memory location within the allocated memory corresponding to the instruction cache line identified by the value of the index;

incrementing the index to correspond to a second memory location within the allocated memory corresponding to the instruction cache line;

writing a data background pattern to a memory location within the allocated memory corresponding to the instruction cache line;

setting the value of the index to the memory location within the allocated memory corresponding to the instruction cache line;

enabling the target instruction cache to execute the instruction cache line corresponding to the memory location within the allocated memory corresponding to the instruction cache line identified by the index; and incrementing the index to correspond to another memory location within the allocated memory corresponding to an instruction cache line.

2. The method of claim 1, wherein the allocating memory comprises dynamically allocating memory.

3. The method of claim 1, further comprising allocating memory of a size equal to a size of a target instruction cache.

4. The method of claim 1, wherein filling the allocated memory with data comprises filling the allocated memory with control transfer instructions and data background patterns.

5. The method of claim 4, wherein the control transfer instructions comprise jump instructions.

6. The method of claim 1, wherein synchronizing a controller thread and a target thread comprises:

initializing a global flag; and setting and clearing the global flag.

7. The method of claim 1, wherein executing a sequence of read operations and write operations comprises performing a March SS test.

8. The method of claim 1, wherein reporting any errors generated as a result of performing read operations and write operations comprises an instruction parity error exception.

9. The method of claim 1, wherein reporting any errors generated as a result of performing read operations and write operations comprises an operating system core dump.

10. A computer system, comprising:

one or more microprocessors;

memory operatively connected to one or more microprocessors; and instructions residing in memory and executable by one or more microprocessors, the instructions for causing the microprocessors to perform:

allocating memory;

binding a controller thread to a microprocessor core;

binding a target thread to another microprocessor core;

filling the allocated memory with data;

synchronizing the controller thread and the target thread to execute a sequence of read operations and write operations on a target instruction cache; and reporting errors generated as a result of performing read operations and write operations, wherein the performing read and write operations on the target instruction cache comprises:

reading a value and writing the value to a memory location within the allocated memory corresponding to an instruction cache line;

setting a value of an index to the memory location within the allocated memory corresponding to an instruction cache line;

enabling a target instruction cache to execute a instruction cache line corresponding to the memory location within the allocated memory corresponding to a instruction cache line, identified by a index;

incrementing a index to correspond to another memory location within the allocated memory corresponding to the instruction cache line;

writing data background pattern to a memory location within the allocated memory corresponding to an instruction cache line;

setting the value of the index to the memory location within the allocated memory corresponding to the instruction cache line;

enabling the target instruction cache to execute the instruction cache line corresponding to the memory location within the allocated memory corresponding to the instruction cache line identified by the index; and incrementing a index to correspond to another memory location within the allocated memory corresponding to an instruction cache line.

11. The method of claim 10, wherein allocating memory comprises dynamically allocating memory.

12. The method of claim 10, wherein allocating memory comprises allocating memory of a size equal to a size of a target instruction cache.

13. The method of claim 10, wherein filling the allocated memory with data comprises filling the allocated memory with control transfer instructions and data background patterns.

14. The method of claim 13, wherein the control transfer instructions comprise jump instructions.

15. The method of claim 10, wherein synchronizing a controller thread and a target thread comprises:

initializing a global flag; and setting and clearing the global flag.

16. The method of claim 10, wherein executing a sequence of read operations and write operations is performing a March SS test.

17. The method of claim 10, wherein reporting any errors generated as a result of performing read operations and write operations comprises an instruction parity error exception.

18. The method of claim 10, wherein reporting any errors generated as a result of performing read operations and write operations comprises an operating system core dump.

* * * * *